(12) United States Patent
Bhattacharya et al.

(10) Patent No.: US 8,569,189 B2
(45) Date of Patent: Oct. 29, 2013

(54) ELECTRONIC TEXTILE

(75) Inventors: Rabin Bhattacharya, Eindhoven (NL); Liesbeth Van Pieterson, Eindhoven (NL); Koen Van Os, Eindhoven (NL); Thomas Schuler, Leuven (BE); Guido Lamerichs, Leuven (BE); Erwin Altewischer, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 427 days.

(21) Appl. No.: 12/994,880

(22) PCT Filed: Jun. 3, 2009

(86) PCT No.: PCT/IB2009/052333
§ 371 (c)(1),
(2), (4) Date: Nov. 29, 2010

(87) PCT Pub. No.: WO2009/150570
PCT Pub. Date: Dec. 17, 2009

(65) Prior Publication Data
US 2011/0100683 A1    May 5, 2011

(30) Foreign Application Priority Data

Jun. 10, 2008  (EP) .................................... 08157906

(51) Int. Cl.
*B32B 5/16*    (2006.01)
(52) U.S. Cl.
USPC ................... 442/72; 442/60; 442/64; 442/71; 442/74; 442/149; 174/254

(58) Field of Classification Search
USPC ............ 442/60, 64, 71, 72, 74, 149; 174/254
See application file for complete search history.

(56) References Cited

U.S. PATENT DOCUMENTS

| 5,177,596 | A | 1/1993 | Muramatsu et al. |
| 6,011,307 | A | 1/2000 | Jiang et al. |
| 6,447,886 | B1* | 9/2002 | Mohamed et al. ............ 428/209 |
| 7,268,479 | B2 | 9/2007 | Aisenbrey |
| 2006/0286716 | A1 | 12/2006 | Takayama |
| 2007/0026695 | A1* | 2/2007 | Lee et al. ........................ 439/37 |

FOREIGN PATENT DOCUMENTS

| EP | 1585197 A1 | 10/2005 |
| GB | 2396252 A | 6/2004 |

* cited by examiner

*Primary Examiner* — Andrew Piziali
(74) *Attorney, Agent, or Firm* — Mark L. Beloborodov

(57) ABSTRACT

The invention relates to an electronic textile comprising a textile substrate having a substrate electrode, and an electronic component having a component electrode. The component electrode is in electrically conductive contact with the substrate electrode via a coupling layer having a directionally dependent conductance so as to preferentially allow an electrical current to flow between the substrate electrode and the component electrode. As the coupling layer does not have to be patterned to prevent the occurrence of parasitic electrical currents, the electrically conductive contact between the substrate electrode and the component electrode has an improved reliability.

5 Claims, 5 Drawing Sheets

ELECTRONIC TEXTILE

FIELD OF THE INVENTION

The invention relates to an electronic textile comprising a textile substrate having a substrate electrode, and an electronic component having a component electrode, the component electrode being in electrically conductive contact with the substrate electrode via a coupling layer.

The invention also relates to a method of manufacturing the electronic textile according to previous paragraph.

BACKGROUND OF THE INVENTION

A textile is a material comprised of interlacing fibers, that can for instance be manufactured by weaving, knitting, crocheting, knotting, or pressing fibers together. Many types of textiles are used in our every day life. When electronic components (i.e. devices that work by controlling the flow of electrons) are integrated into a textile new application fields emerge. When the textile is an integral part of the electrical circuit comprising the electronic components, an electronic textile is obtained.

An example of an electronic component is a LED package in the form of a surface mounted device (SMD-LED), which can be attached to a textile substrate by gluing, soldering, snap button connection or stitching. The resulting light-emitting textile that could open up a wide range of new interior and apparel applications, ranging from illumination to atmosphere creation to messaging.

An electronic textile is known from UK patent application GB2396252A. The known light-emitting textile comprises SMD-LED's that are fixed by an electrically conductive epoxy to a fabric member having electrically conductive textile tracks.

A drawback of the known electronic textile is a poor reliability of the electrically conductive contact between the SMD-LED's and the electrically conductive textile tracks comprised in the fabric member.

SUMMARY OF THE INVENTION

It is an object of the invention to provide an electronic textile comprising a textile substrate having a substrate electrode, and an electronic component having a component electrode, the component electrode being in electrically conductive contact with the substrate electrode via a coupling layer, wherein the coupling layer comprises a material that enables an improved reliability of the electrically conductive contact.

It is a further object of the invention to provide a method for manufacturing the electronic textile according to the previous paragraph.

According to a first aspect of the invention the object is realized by an electronic textile comprising a textile substrate having a substrate electrode, and an electronic component having a component electrode, the component electrode being in electrically conductive contact with the substrate electrode via a coupling layer, characterized in that the coupling layer comprises an anisotropically conductive material.

An anisotropically conductive material is a material that has a directionally dependent electrical conductance. In other words, the electrical conductance of the material is different when measured along different axes. In the context of this invention, the anisotropically conductive material is provided such that the direction of highest electrical conductance is between the substrate electrode and the component electrode.

The electrically conductive epoxy used in the known electronic textile serves to improve the electrical contact between the component electrode and the substrate electrode. However, as the electrically conductive epoxy is an isotropically conductive material (i.e. the electrical conductance of the material is similar when measured along different axes), it has to be applied in a patternwise manner in order to prevent the occurrence of a parasitical electrical current (i.e. an undesired electrical current that is due to an unintentional cause).

The inventors have realized that a proper patternwise application of an coupling layer on a textile substrate is seriously hampered by dimensional instabilities of the textile substrate, meaning that dimensions of the textile substrate may, for instance, change as a result of stretching or heating the textile substrate. As a result, the reliability of the electrically conductive contact between the substrate electrode and the component electrode cannot be optimally improved by using a coupling layer comprising an isotropically conductive material.

In contrast to a coupling layer comprising an isotropically conductive material, the tolerance of applying a coupling layer comprising an anisotropically conductive material is much larger as it can be applied to cover an area that extends beyond the area wherein the electronic component has to be in electrically conductive contact with the textile substrate. Consequently, the use of a coupling layer comprising an anisotropically conductive material is much less sensitive to dimensional instabilities of the textile substrate, and it may act as an under fill layer to improve the mechanical reliability of the connection between the textile substrate and the electronic component.

An additional advantage is that the coupling layer, when present at locations on the textile substrate where no electronic component is connected, can be used as an adhesive for attaching a second layer to the textile substrate, such as a covering textile layer to improve the appearance and/or the robustness of the electronic textile.

In a first embodiment of the electronic textile according to the invention, the anisotropically conductive material comprises an electrically insulative binder and electrically conductive particles. When in such a coupling layer the electrically conductive particles are dispersed in the electrically insulative binder at a concentration that is too low to allow the pre-existence of an electrically conductive path, only at the location where the electronic component has been provided on the textile substrate will an electrically conductive path be created as a result of compressing the anisotropically conductive material. Electrically conductive contact between the component electrode and the substrate electrode can either be made by direct physical contact between the substrate electrode and the component electrode, or by indirect contact via electrically conductive particles that have been trapped between the component electrode and the substrate electrode.

In a second embodiment of the electronic textile according to the invention, the anisotropically conductive material comprises an electrically insulative binder and electrically conductive particles, wherein the electrically conductive particles are elastic. The elasticity of the electrically conductive particles results in them being reversibly deformable under stress, such as when they get trapped between the component electrode and the substrate electrode. In this way, the electrically conductive contact between the component electrode and the substrate electrode is further improved as the reversibly deformed electrically conductive particles exert a pressure on both electrodes.

In a third embodiment of the electronic textile according to the invention, the anisotropically conductive material comprises an electrically insulative binder and electrically conductive particles, wherein the electrically insulative binder is a compound chosen from the group consisting of thermosetting and thermoplastic synthetic resins. This embodiment further improves the reliability of the electrically conductive contact between the substrate electrode and the component electrode as compressive strain in the thermosetting or thermoplastic synthetic resins causes the electronic component to be pulled towards the textile substrate.

In a fourth embodiment of the electronic textile according to the invention, the substrate electrode comprises an electrically conductive yarn, and the anisotropically conductive material is an outer layer of the electrically conductive yarn. This embodiment allows the use of an electrically conductive yarn as substrate electrode that can be insulated while at the same time allowing for an improved mechanical and electrically conductive contact to be made to the component electrode.

In a fifth embodiment of the electronic textile according to the invention, the electronic component comprises a clamping member. This embodiment further improves the reliability of the electrically conductive contact between the substrate electrode and the component electrode by the clamping member pulling the electronic component towards the textile substrate.

According to a second aspect of the invention the object is realized by a method of manufacturing an electronic textile comprising a textile substrate having a substrate electrode, and an electronic component having a component electrode, the method comprising the steps of providing one of the substrate electrode and the component electrode with a coupling layer that is electrically insulative in a direction along the layer and that is arranged to permit electrical conductivity in a direction normal to the coupling layer, and establishing an electrically conductive contact between the substrate electrode and the component electrode via the coupling layer.

In a first embodiment of the method according to the invention, the coupling layer comprises an electrically insulative binder and electrically conductive particles, and wherein the step of establishing an electrically conductive contact between the substrate electrode and the component electrode via the coupling layer comprises an application of pressure in a direction normal to the coupling layer.

BRIEF DESCRIPTION OF THE DRAWINGS

Examples of the invention will now be described in detail with reference to the accompanying drawings, in which.

It should be noted that these figures are diagrammatic and not drawn to scale. For the sake of clarity and convenience, relative dimensions and proportions of parts of these figures have been shown exaggerated or reduced in size.

DETAILED DESCRIPTION OF THE EMBODIMENTS

In the following description, the present invention is described with reference to exemplary electronic textiles according to the invention.

Figure 1:
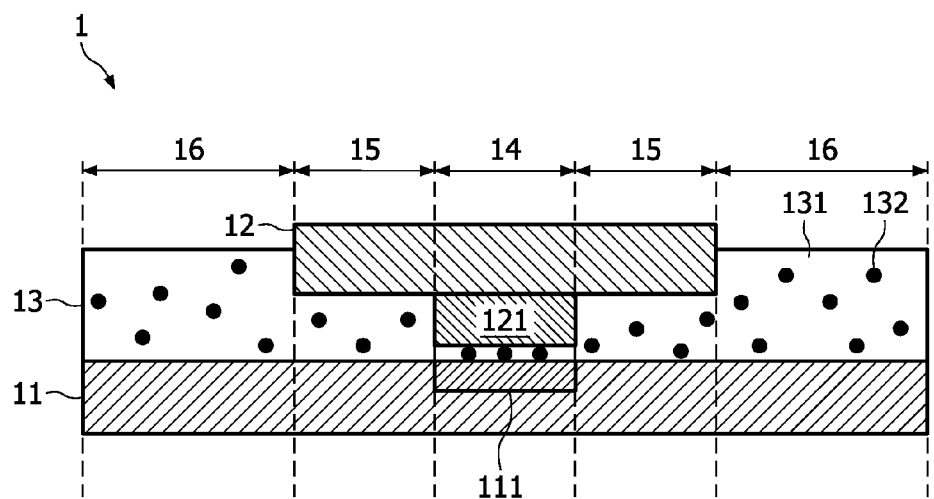
FIG. 1 shows a schematic cross-section of a first embodiment of an electronic textile according to the invention.

FIG. 1 shows a schematic cross-section of the electronic textile 1 according to the invention. The electronic textile 1 comprises the textile substrate 11 having the substrate electrode 111, and the electronic component 12 having the component electrode 121. The substrate electrode 111 is connected to the component electrode 121 via the anisotropically conductive material 13.

Preferably the anisotropically conductive material 13 is applied as a tape, but it can also be applied as a foil, a paste, a grid, or in the form of areas such as strips.

In FIG. 1, the anisotropically conductive material 13 comprises the electrically insulative binder 131 and electrically conductive particles 132. The electrically insulative binder 131 comprises a thermosetting synthetic resin, and the electrically conductive particles 132 are spherical particles with a diameter of about 3 to 5 micrometer. Alternatively, a thermoplastic synthetic resin may also be used as electrically insulative binder.

In the state wherein the anisotropically conductive material 13 is applied (i.e. before the electronic component 12 has been connected to the textile substrate 11), it is electrically insulative as the electrically conductive particles 132 are spaced too far apart to form an electrically conductive path. For this purpose, the concentration of the electrically conductive particles 132 in the anisotropically conductive material 13 is preferably in a range of about 5 to 10 volume percent.

During connection of the electronic component 12, pressure is exerted on the anisotropically conductive material 13, and the material is locally compressed so that the electrically conductive particles 132 move closer together. As the electrically insulative binder 131 comprises a thermosetting synthetic resin, a force is exerted at locations where the anisotropically conductive material 13 is compressed, the force being such that the electronic component 12 is being pulled towards the textile substrate 11.

At the location 14, the component electrode 121 is connected to the substrate electrode 111, and the anisotropically conductive material 13 has been compressed to such an extent that several electrically conductive particles 132 have been trapped between the component electrode 121 and the substrate electrode 111, thereby creating an electrically conductive path between the two electrodes. In FIG. 1, the component electrode 121 and the substrate electrode 111 are connected via a monolayer of electrically conductive particles 132. Of course, the connection may, at least partly, also be formed by a multilayer of electrically conductive particles 132, or by direct physical contact between the component electrode 121 and the substrate electrode 111.

At the location 15, where the component electrode 121 is not connected to the substrate electrode 111, the anisotropically conductive material 13 acts as a non-conductive under fill layer, and improves the adhesive strength between the electronic component 12 and the textile substrate 11.

At the location 16, the anisotropically conductive material 13 is not compressed. Here it is exposed and available for attachment of an auxiliary layer, such as a protective and/or decorative layer.

Figure 2:
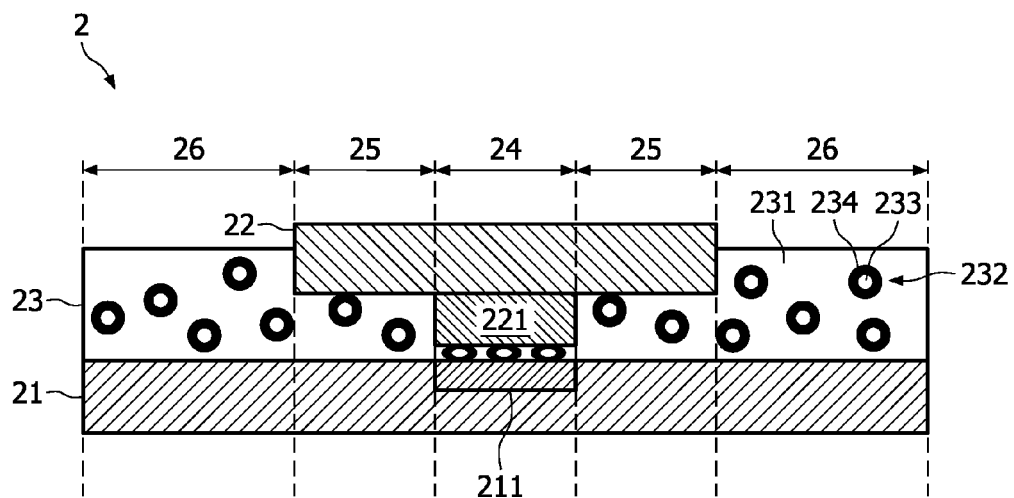
FIG. 2 shows a schematic cross-section of a second embodiment of an electronic textile according to the invention.

FIG. 2 shows a schematic cross-section of the electronic textile 2 according to the invention. The electronic textile 2 comprises the textile substrate 21 having the substrate electrode 211, and the electronic component 22 having the component electrode 221. The substrate electrode 211 is connected to the component electrode 221 via the anisotropically conductive material 23. The anisotropically conductive material 23 comprises the electrically insulative binder 231 and electrically conductive particles 232.

The electrically conductive particles 232 are elastic, which means that they are capable of reversibly deforming under stress. For this purpose, the electrically conductive particles 232 comprise a synthetic resin core 233 that is coated with an electrically conductive material 234, such as a metal. Preferably, the synthetic resin core 233 is coated with a Ni—Au layer, as Ni provides the electrically conductive particles 232 with a high hardness, and Au with a high corrosion resistance and a high conductance. At the location 24, the component electrode 221 is connected to the substrate electrode 211, and the anisotropically conductive material 23 has been compressed to such an extent that several electrically conductive particles 232 have been trapped between the component electrode 221 and the substrate electrode 211, thereby creating an electrically conductive path between the two electrodes. Furthermore, when the trapped electrically conductive particles 232 are deformed, their elasticity causes them to constantly press outward on both the substrate electrode 211 and the component electrode 221, thereby improving the reliability of the electrically conductive contact between the two electrodes.

Figure 3:
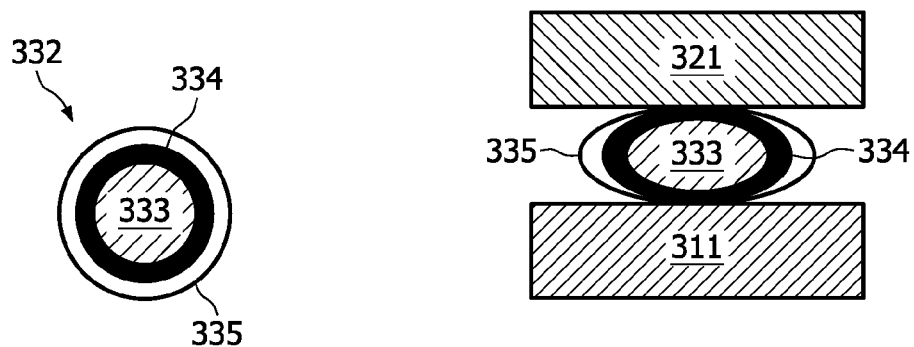
FIG. 3 shows a schematic cross-section of an electrically conductive particle that may be used in an electronic textile according to the invention.

FIG. 3 shows a schematic cross-section of the electrically conductive particle 332, that may also be used as electrically conductive particle in an anisotropically conductive material. The electrically conductive particle 332 comprises a synthetic resin core 333 that is coated with an electrically conductive material 334, such as a Ni—Au layer. The electrically conductive particle 332 further comprises an electrically insulative outer layer 335, that can be pushed away when the electrically conductive particle 332 is trapped and deformed between the substrate electrode 311 and the component electrode 321, allowing the electrically conductive layer 234 to establish an electrically conductive connection between the substrate electrode 311 and the component electrode 321. The electrically insulative outer layer 335 prevents the electrically conductive particle 332 from forming an electrically conductive contact in a direction perpendicular to the direction wherein it is deformed, such as the direction parallel to the plane of the textile substrate.

Figure 4:
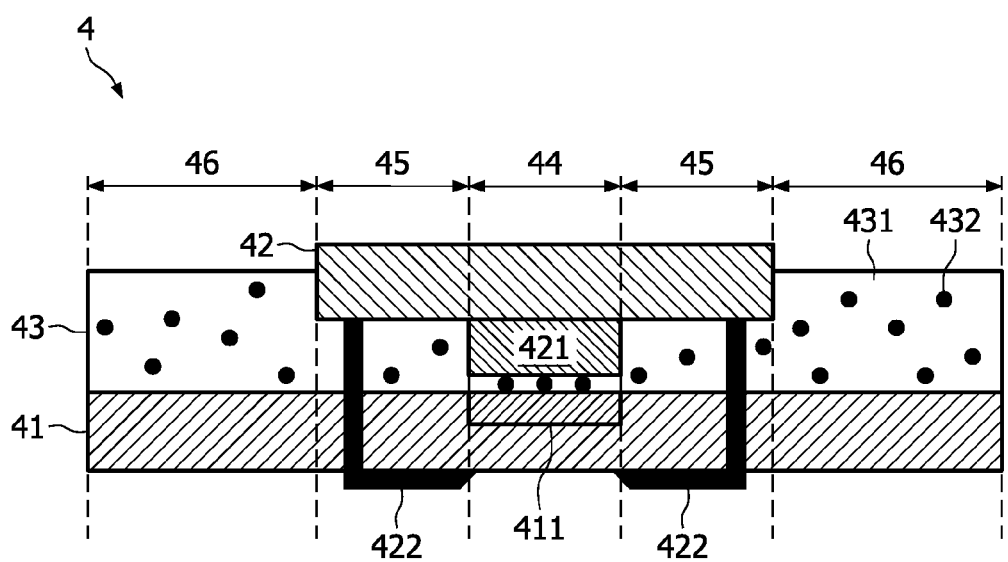
FIG. 4 shows a schematic cross-section of a third embodiment of an electronic textile according to the invention.

FIG. 4 shows a schematic cross-section of the electronic textile 4 according to the invention. The electronic textile 4 comprises the textile substrate 41 having the substrate electrode 411, and the electronic component 42 having the component electrode 421. The substrate electrode 411 is connected to the component electrode 421 via the anisotropically conductive material 43. The anisotropically conductive material 43 comprises the electrically insulative binder 431 and electrically conductive particles 432.

In order to increase the pressure that is used to compress the anisotropically conductive material 43 at the locations 44 and 45, so as to obtain an improved mechanical and electrically conductive connection between the electronic component 42 and the textile substrate 41, the electronic component 42 comprises clamping members 422. In FIG. 4, the clamping members 422 have penetrated through the textile substrate 41. Alternatively, a clamping member may also be used that wraps around an edge of a textile substrate. A clamping member and a component electrode may be integrated into a single element.

Next to the anisotropically conductive materials 13, 23, and 43 as shown in FIGS. 1, 2, and 4, respectively, other types of anisotropically conductive materials may be used in an electronic textile according to the invention.

A first example of an alternative anisotropically conductive material comprises a quantum tunneling composite. A quantum tunneling composite comprises electrically conductive particles dispersed in an electrically insulative binder. Similarly as for the anisotropically conductive material 13 of FIG. 1, without pressure, the electrically conductive particles are too far apart to conduct an electrical current, but when pressure is applied they move closer to the extent that electrons can tunnel through the electrically insulative binder.

A second example of an alternative anisotropically conductive material comprises an electrically insulative binder and electrically conductive particles that are aligned such that electrically conductive paths exist in a direction normal to the surface of the anisotropically conductive material. In contrast to the examples presented above, here the anisotropically conductive material is already anisotropically conductive prior to connection of an electronic component to a textile substrate. The electrically conductive particles may have been aligned by applying an external stimulus, such as a magnetic field, or via a self-alignment process.

Figure 5:
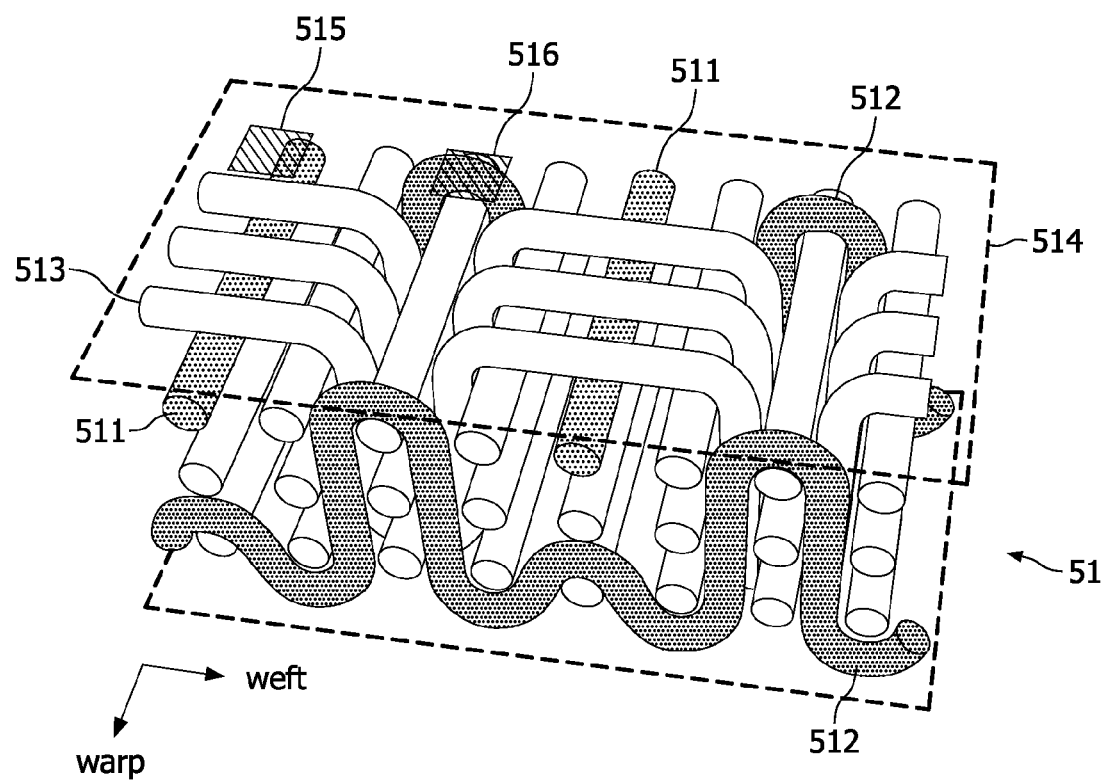
FIG. 5 shows a textile substrate for use in an embodiment of an electronic textile according to the invention.

FIG. 5 shows the textile substrate 51 for use in a further embodiment of an electronic textile according to the invention. The textile substrate 51 comprises electrically conductive warp and weft yarns 511 and 512, respectively, and electrically insulative yarns 513. The electrically conductive warp and weft yarns 511 and 512 are partly exposed at the surface 514 of the textile substrate 51, making them available for connecting to electronic components, for instance via the connector areas 515 and 516.

Figure 6:
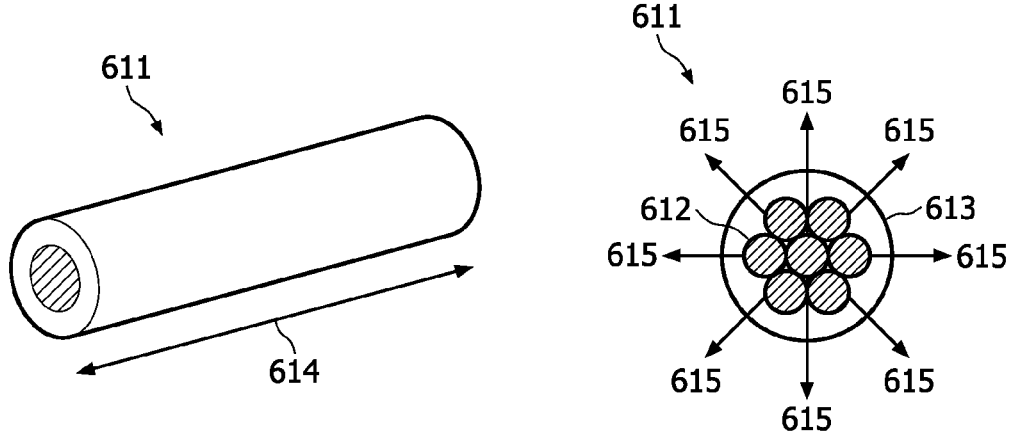
FIG. 6 shows a perspective view and a cross-section of a first yarn that can be used in the textile substrate of FIG. 5.

FIG. 6 shows a perspective view and a cross-section of the yarn 611. The yarn 611 can be used as electrically conductive warp or weft yarn in the textile substrate 51 of FIG. 5. The electrically conductive yarn 611 comprises a bundle of electrically conductive fibers 612, the bundle being coated with an outer layer 613. The outer layer 613 is an anisotropically conductive material according to any of the anisotropically conductive materials described hereinbefore. Accordingly, the outer layer 613 is electrically insulative in the direction 614 along the yarn 611, and it is arranged to permit electrical conductivity in the directions 615 normal to the yarn 611.

Figure 7:
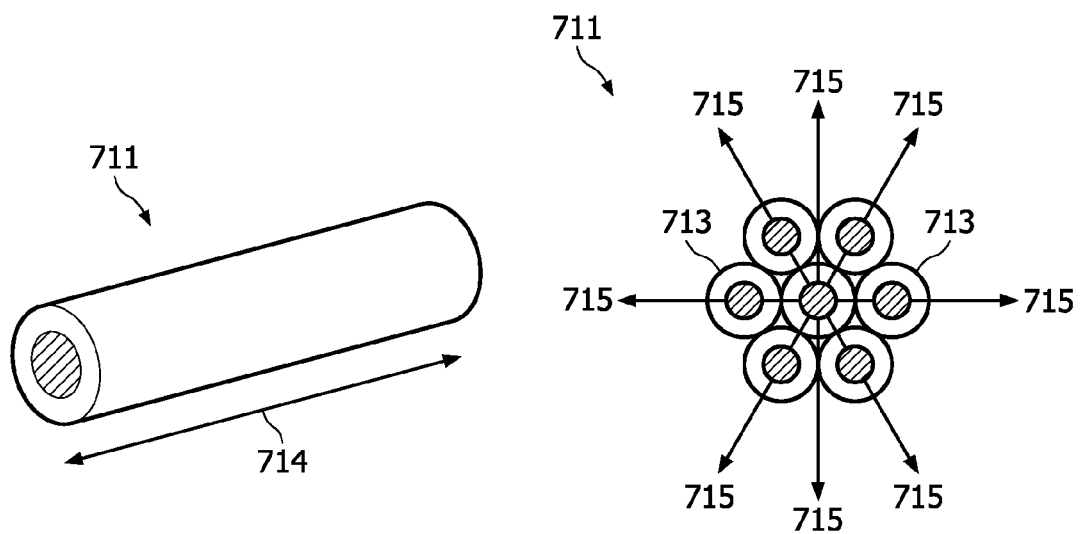
FIG. 7 shows a perspective view and a cross-section of a second yarn that can be used in the textile substrate of FIG. 5.

FIG. 7 shows a cross-section of the yarn 711. The yarn 711 can be used as electrically conductive warp or weft yarn in the textile substrate 51 of FIG. 5. The electrically conductive yarn 711 comprises electrically conductive fibers 712, each of which is separately coated with an outer layer 713. The outer layer 713 is an anisotropically conductive material according to any of the anisotropically conductive materials described hereinbefore. Accordingly, the outer layer 713 is electrically insulative in the direction 714 along the yarn 711, and it is arranged to permit electrical conductivity in the directions 715 normal to the yarn 711.

An additional advantage of the yarns 611 and 711 is that the properties of the outer layers 613 and 713, respectively, may be chosen such as to improve the weavability of the yarns.

Figure 8:
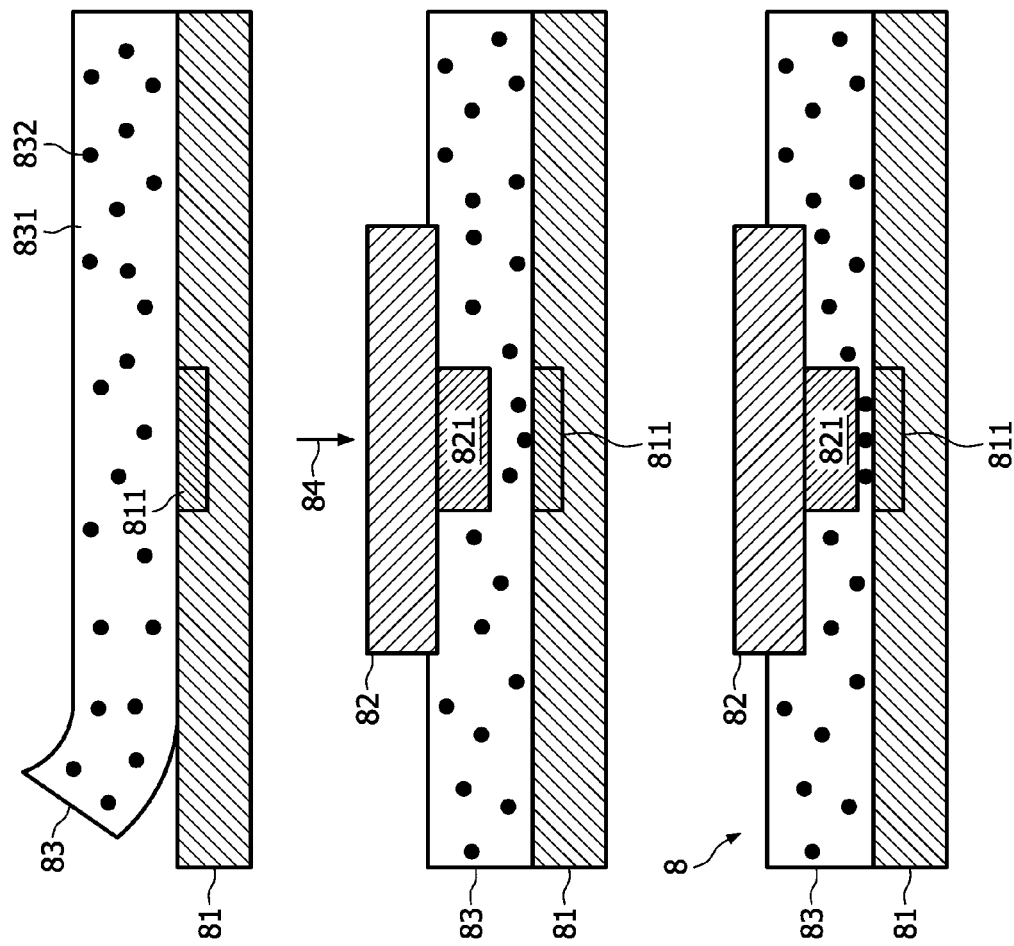
FIG. 8 shows a method of manufacturing an electronic textile according to the invention.

FIG. 8 schematically shows a method of manufacturing the electronic textile 8 comprising the textile substrate 81 having the substrate electrode 811, and the electronic component 82 having the component electrode 821.

In the first phase (a), the coupling layer 83, comprising the thermosetting electrically insulative binder 831 and the electrically conductive particles 832, is applied to the substrate electrode 811. During step (a), the coupling layer 83 is softened by increasing its temperature (dependent on the composition of the coupling layer 83, but typically up to a temperature of about 100 degrees Celsius), and pressure (typically about 1 MPa) is applied to laminate the coupling layer 83 onto the textile substrate 81.

In the second phase (b), the electronic component 82 is positioned relative to the textile substrate 81 such that the projection of the component electrode 821 on the textile substrate 81 overlaps with the substrate electrode 811. The electronic component 82 is then moved towards the textile substrate 81 by applying a pressure (typically about 4 to 5 MPa) in the direction 84 normal to the textile substrate 81. Similarly as during step (a), also during step (b) the coupling layer 83 is softened by increasing its temperature. Again, the conditions for softening the coupling layer 83 are dependent on the composition of the coupling layer 83. Preferably, during step (b) the coupling layer 83 is softened to a higher extent than during step (a), typically by increasing the temperature of the coupling layer 83 up to about 200 degrees Celsius. The component electrode 821 is pressed into the softened coupling layer 83 towards the substrate electrode 811 to an extent that an electrically conductive connection is obtained between the component electrode 821 and the substrate electrode 811. Typically, the electronic component 82 is held down for approximately 10 seconds.

In the third phase (c), the pressure on the electronic component 82 is released, and the temperature of the coupling layer 83 is reduced to room temperature, in order to obtain the electronic textile 8.

While in FIG. 8 the coupling layer 83 is applied in the form of a layer that is laminated onto a substrate, a coupling layer can also be applied from a liquid phase, by a coating technique comprising for instance jetting, printing, spraying, or dispensing from a syringe. Furthermore, while in FIG. 8, prior to establishing an electrically conductive contact between the substrate electrode 811 and the component electrode 821, the substrate electrode 811 is provided with the coupling layer 83, it is also possible to first provide a component electrode with a coupling layer.

While the invention has been illustrated and described in detail in the drawings and foregoing description, such illustration and description are to be considered illustrative or exemplary and not restrictive; the invention is not limited to the disclosed embodiments. Variations to the disclosed embodiments can be understood and effected by those skilled in the art in practicing the claimed invention, from a study of the drawings, the disclosure, and the appended claims. In the claims, the word "comprising" does not exclude other elements, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. An electronic textile comprising a textile substrate having a substrate electrode, and an electronic component having a component electrode, the component electrode being in electrically conductive contact with the substrate electrode via a coupling layer comprising an anisotropically conductive material, wherein the substrate electrode comprises an electrically conductive yarn, and wherein the anisotropically conductive material is an outer layer of the electrically conductive yarn.

2. The electronic textile according to claim 1, wherein the anisotropically conductive material comprises an electrically insulative binder and electrically conductive particles.

3. The electronic textile according to claim 2, wherein the electrically conductive particles are elastic.

4. The electronic textile according to claim 2, wherein the electrically insulative binder comprises a compound chosen from the group consisting of thermosetting and thermoplastic synthetic resins.

5. The electronic textile according to claim 1, wherein the electronic component comprises a clamping member.

* * * * *